(12) United States Patent
Lih et al.

(10) Patent No.: US 6,737,799 B1
(45) Date of Patent: May 18, 2004

(54) ACTIVE MATRIX ORGANIC LIGHT EMITTING DIODE DISPLAY AND FABRICATION METHOD OF THE SAME

(75) Inventors: Jiin-Jou Lih, Taichung (TW); Chih-Feng Sung, Miaoli (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/248,336

(22) Filed: Jan. 10, 2003

(30) Foreign Application Priority Data

Nov. 19, 2002 (TW) ........................ 91133680 A

(51) Int. Cl.$^7$ ............................................. H05B 33/00
(52) U.S. Cl. ................................... 313/498; 313/512
(58) Field of Search ........................... 313/498, 500, 313/505, 512, 504; 428/917; 315/169.3; 362/310, 800

(56) References Cited

U.S. PATENT DOCUMENTS 6,623,324 B2 * 9/2003 Tanaka ..................... 445/24
6,628,071 B1 * 9/2003 Su ............................ 313/512
6,660,409 B1 * 12/2003 Komatsu et al. ............ 428/690

* cited by examiner

*Primary Examiner*—Ashok Patel
(74) *Attorney, Agent, or Firm*—Jiang Chyun IP Office

(57) ABSTRACT

An active matrix organic light emitting diode display and a fabrication method of the same. A substrate having a display area and a non-display area is provided. A plurality of pixel structures is formed in the display area, and a plurality of transparent conductive lines to electrically connect the pixel structures are formed on the substrate. The transparent conductive lines extend from the display area to the non-display area. A photosensitive glue is formed at a periphery of the display area, and a cap is formed to cover the display area. The cap is adhered to the substrate using the photosensitive glue. A radiation step is performed on a rear surface of the substrate to cure the photosensitive glue. A driving chip electrically connected to the pixel structures via the transparent conductive lines is formed in the non-display area.

6 Claims, 2 Drawing Sheets

ACTIVE MATRIX ORGANIC LIGHT EMITTING DIODE DISPLAY AND FABRICATION METHOD OF THE SAME

CROSS REFERENCE TO RELATED APPLICATIONS

This application claims the priority benefit of Taiwan application serial no. 91133680, filed Nov. 19, 2002.

BACKGROUND OF INVENTION

1. Field of the Invention

The invention relates in general to a flat panel display and a fabrication method thereof, and more particularly, to an active matrix organic light emitting diode (AMOLED) and a fabrication method thereof.

2. Related Art of the Invention

The organic light emitting diode is a semiconductor device with high conversion efficiency by converting electric energy into optical energy. The common application includes indicators, display panel and light emitting device for optical pickup head. Having the properties such as viewing-angle independency, simple process, low cost, high response speed, broad application temperature range and full color, the organic light emitting diode meet with the requirement of modern display and becomes a very popular research topic.

Following the intensive research, the active matrix organic light emitting diode having an organic light emitting layer and a cathode layer formed on a substrate having a thin-film transistor array formed thereon has been developed. The active matrix organic light emitting diode display is driven by the thin-film transistor. The fabrication of the conventional active matrix organic light emitting diode display is introduced as follows.

FIG. 1 shows a top view of a conventional active matrix organic light emitting diode display. FIG. 2 shows a cross sectional view along line I-I" of FIG. 1.

Referring to FIGS. 1 and 2, a substrate 100 on which a display area 120 and a non-display area 122 are formed is provided. The display area 120 of the substrate 100 further comprises a plurality of pixel structures 107 arranged as an array thereon. Each of the pixel structures 107 comprises an active device (thin-film transistor), an anode layer 102, a luminescent layer 104 and a cathode layer 106.

Each pixel structure 107 is controlled by a scan line (not shown) and a data line (not shown). The scan lines and data lines located in the display area 120 extends towards the non-display area 122 to form a plurality of fan-outs 108 extending externally. The fan-outs 108 are used to electrically connect the driving chip subsequently formed in the non-display area 122.

An ultra-violet (UV) glue 112 is formed at a perimeter of the display area 120 on the substrate 100, while a cap 114 is disposed over the substrate 100. The substrate 100 and the cap 114 are then adhered via the UV glue 112. An UV radiation 116 is performed to cure the UV glue 112, so as to seal the display area 122 within the substrate 100 and the cap 114. A driving chip 110 is then formed on the non-display area 122 of the substrate 100. The driving chip 110 is electrically connected to the pixel structures 107 via the fan-outs 108.

In the conventional process, the fan-outs 108 electrically connecting the pixel structures 107 and the driving chip 110 is made of the same metal material of the scan lines and the data lines. A part of the UV glue 112 is blocked by the fan-outs 108 and unable to absorb the UV radiation 116. Consequently, this part of UV glue 112 is not cured properly to result in negative effect of the package. That is, moisture is easily to penetrate through the part of UV glue 112, which is cured incompletely to damage the internal device of the display.

SUMMARY OF INVENTION

The present invention provides an active matrix organic light emitting diode display and a fabrication method thereof to improve the incomplete packaging problem caused in the conventional structure formed by the conventional fabrication method.

The method of fabricating an active matrix organic light emitting diode comprises the following steps. A substrate having a display area and a non-display area thereon is provided. A plurality of pixel structures is formed in the display area. Each pixel structure comprises an active device (thin-film transistor), an anode layer, a luminescent layer and a cathode layer. A plurality of transparent conductive lines is formed in the non-display area for providing electrical connection to the pixel structures. The transparent conductive lines can be defined by the step of forming the anode. The material for forming the transparent conductive lines includes indium tin oxide or indium zinc oxide. A photosensitive glue is applied at a perimeter of the display area on the substrate. A cap is disposed over the display area of the substrate and adhered to the substrate to cover the display area via the photosensitive glue. A radiation step is performed to cure the photosensitive glue. A driving chip is then formed on the non-display area and electrically connected to the pixel structures via the transparent conductive lines.

The active matrix organic light emitting diode provided by the present invention comprises a substrate, a driving chip, a plurality of transparent conductive lines, a cap and a photosensitive glue. The substrate has a display area and a non-display area, and a plurality of pixel structures formed in the display area. Each of the pixel structure comprises an active device (thin-film transistor), an anode layer, a luminescent layer and a cathode layer. The driving chip is formed in the non-display area of the substrate. The transparent conductive lines are disposed on the substrate and extend from the display area towards the non-display area to provide electric connection between the driving chip and the pixel electrodes. The material for forming the transparent conductive lines includes indium tin oxide and indium zinc oxide. In addition, the cap is located above the display area of the substrate to encapsulate the pixel structures.

The present invention uses transparent conductive lines to provide electric connection between the pixel structures and the driving chip instead of using the fan-outs described above. Therefore, the problem of incomplete curing the UV glue is resolved in the present invention.

As the display area is sealed within the cap and the completely cured photosensitive glue, the internal device of the display will not be damaged by the moisture penetration.

The present invention thus improves the defect of the conventional structure and process, such that the reliability of the display is enhanced.

BRIEF DESCRIPTION OF DRAWINGS

These, as well as other features of the present invention, will become more apparent upon reference to the drawings wherein.

DETAILED DESCRIPTION

Figure 1:
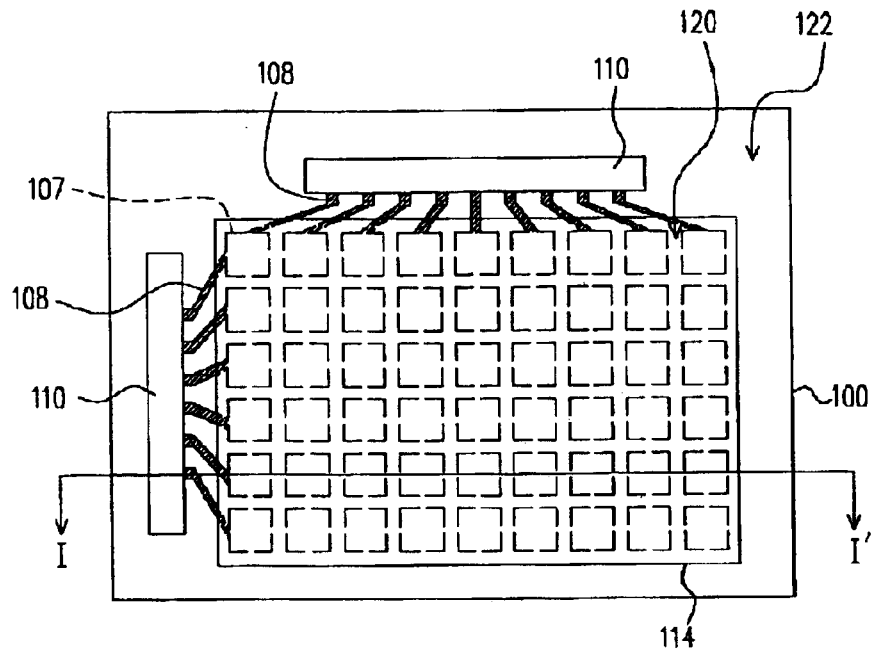
FIG. 1 shows a top view of a conventional active matrix organic light emitting diode display.
Figure 2:
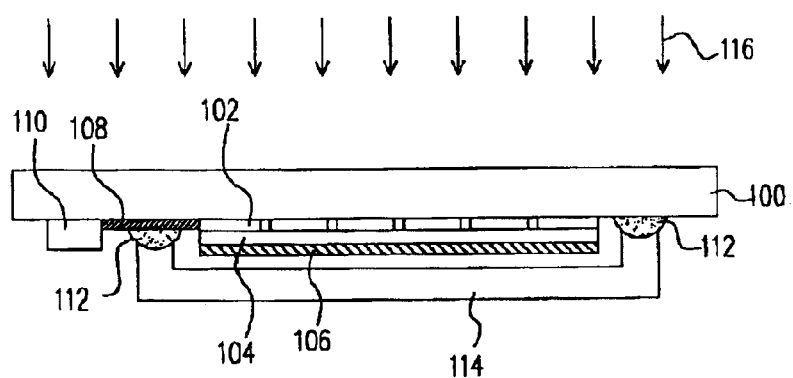
FIG. 2 shows a cross sectional view along the line I-I' as shown in FIG. 1.
Figure 3:
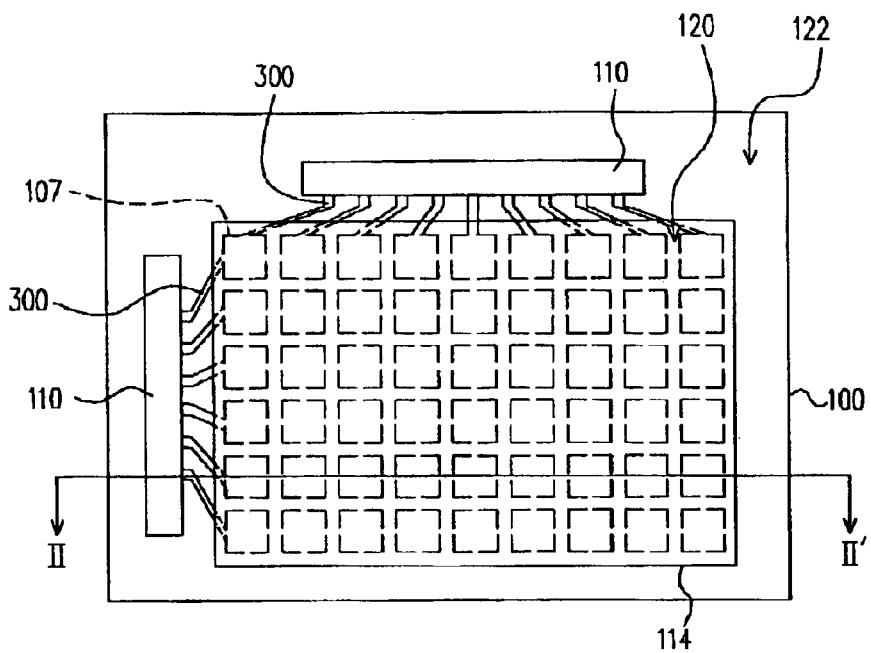
FIG. 3 shows a top view of an active matrix organic light emitting diode display according to the present invention.
Figure 4:
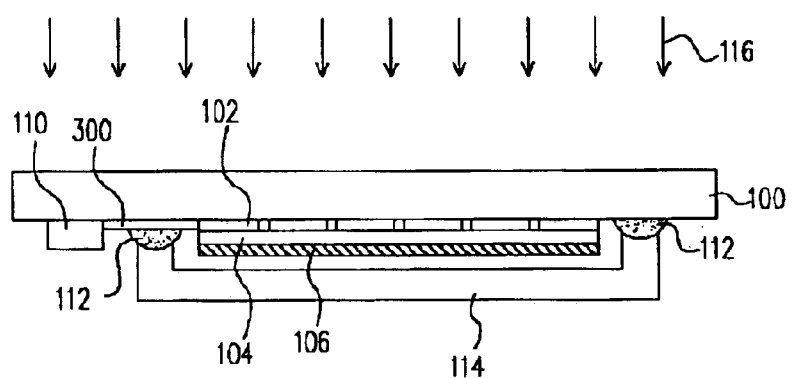
FIG. 4 shows a cross sectional view along the line II-II" as shown in FIG. 3.

FIG. 3 shows a top view of an active matrix organic light emitting diode provided by the present invention, and FIG. 4 shows a cross sectional view along line II-II' as shown in FIG. 3.

Referring to FIGS. 3 and 4, a substrate 100 is provided. The substrate 100 comprises a display area 120 and a non-display area 122. A plurality of pixel structures 107 is formed in the display area 120. Each of the pixel structures 107 comprises an active device (thin-film transistor), an anode layer 102, a luminescent layer 104 and a cathode layer 106.

While forming the anode layer 102 of the pixel structures 107, a plurality of transparent conductive lines 300 are simultaneously defined in the non-display area 120 extending from two edges of the display area 120 to the non-display area 122 for forming a plurality of fan-outs. In this embodiment, the length of the transparent conductive lines 300 is about 2 mm to about 4 mm for providing electrical connection between a driving chip formed subsequently in the non-display area and the pixel structures 107. Therefore, the signals generated by the driving chip can be delivered to the pixel structures 107.

As the transparent conductive lines 300 are defined simultaneously with the anode layer 102, the material for forming the transparent conductive lines 300 is thus the same as that of the anode layer 102. The material includes indium tin oxide or indium zinc oxide.

A photosensitive glue 112 is formed at a perimeter of the display area 120 on the substrate 100. An encapsulate cap 114 is disposed over the substrate 100 and adhered thereto via the photosensitive glue 112 for covering the display area 120. The material for forming the cap 114 includes impermeable metal or glass. The photosensitive glue 112 includes an UV glue, for example.

An UV radiation 116 is then performed to cure the photosensitive glue 112. Meanwhile, as the transparent conductive lines 112 extending from the display area 120 to the non-display area 122 are transparent, the UV radiation 116 can be absorbed by every part of the photosensitive glue 112, which can thus be completely cured. As a result, an improved package and isolation effect can be obtained by the cured photosensitive glue 112.

A driving chip 110 is then formed in the non-display area 122 of the substrate. The electrical connection between the driving chip 110 and the pixel structures 107 is achieved via the conductive transparent lines 108.

Therefore, the active matrix organic light emitting diode display provided by the present invention comprises a substrate 100, a driving chip 110, a plurality of transparent conductive lines 300, an encapsulating cap 114 and a photosensitive glue 112.

The substrate 100 has a display area 120 and a non-display area 122, where the display area 120 further comprises a plurality of pixel structures 107, each including an active device (thin-film transistor), an anode layer 102, a luminescent layer 104 and a cathode layer 106. The driving chip 110 is located in the non-display area 122. A plurality of transparent conductive lines 300 is formed on the substrate 100. The transparent conductive lines 300 extend from the display area 120 towards the non-display area 122 to electrically connect the pixel structures 107 and the driving chip 110. The material for forming the transparent conductive lines 300 includes indium tin oxide or indium zinc oxide.

The encapsulating cap 114 is located over the substrate 100 to cover the display area 120 of the substrate 100. The photosensitive glue 112 is applied along a perimeter of the display area 120 on the substrate 100 to adhere the cap 114 and the substrate 100.

It is appreciated that while forming the transparent conductive lines 300, a power source line (not shown) may also be formed in the non-display area 122 of the substrate 160. The power source line is electrically connected to the pixel structures 107 to provide source energy to the pixel structures 107 from an external power supply.

In addition, although the transparent conductive lines 300 (made of indium tin oxide or indium zinc oxide) for connecting the pixel structures 107 and the driving chip 110 has resistance relatively higher than that of metal, as the typical driving chip 110 hardly requires a large current, and the length of the transparent conductive lines 300 is only about 2 mm to about 4 mm (the distance between the pixel structures 107 and the driving chip 110), the effect upon signal attenuation is very minor. Further, should signal is attenuated thereby, the attenuation can be compensated by increasing the signal voltage output from the driving chip 110.

Accordingly, the present invention has the following advantages.

1. The present invention uses transparent conductive lines to provide electric connection between the pixel structures and the driving chip instead of using the fan-outs described above. Therefore, the problem of incomplete curing the UV glue is resolved in the present invention.

2. As the display area is sealed within the cap and the completely cured photosensitive glue, the internal device of the display will not be damaged by the moisture penetration.

3. The present invention thus improves the defect of the conventional structure and process, such that the reliability of the display is enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An active matrix organic light emitting diode display, comprising:
   a substrate, having a display area and a non-display area thereon and the display area further comprising a plurality of pixel structures thereon;
   a driving chip, formed in the non-display area of the substrate;
   a photosensitive glue, applied at a periphery of the display area on the substrate for adhering the cap with the substrate;
   a plurality of transparent conductive lines disposed over the photosensitive glue; and
   a sealing cap, over the substrate to cover the display area.

2. The display according to claim 1, wherein material for forming the transparent conductive lines includes indium tin oxide or indium zinc oxide.

3. The display according to claim 1, wherein the transparent conductive lines have a length between about 2 mm to about 4 mm.

4. The display according to claim 1, wherein the photosensitive glue includes an ultra-violet glue.

5. The display according to claim 1, wherein the cap includes a glass cap or a metal cap.

6. The display according to claim 1, where in the plurality of transparent conductive lines extends from the display area to the non-display area to electrically connect the pixel structures and the driving chip.

* * * * *